United States Patent [19]

Shimada et al.

[11] Patent Number: 5,229,323
[45] Date of Patent: Jul. 20, 1993

[54] METHOD FOR MANUFACTURING A SEMICONDUCTOR DEVICE WITH SCHOTTKY ELECTRODES

[75] Inventors: Kizashi Shimada, Yokohama; Tatsuo Akiyama, Tokyo; Yutaka Koshino, Yokohama, all of Japan

[73] Assignee: Kabushiki Kaisha Toshiba, Kawasaki, Japan

[21] Appl. No.: 846,985

[22] Filed: Mar. 9, 1992

Related U.S. Application Data

[63] Continuation of Ser. No. 556,611, Jul. 24, 1990, abandoned, which is a continuation of Ser. No. 234,042, Aug. 19, 1988, abandoned.

[30] Foreign Application Priority Data

Aug. 21, 1987 [JP] Japan .................. 62-207540

[51] Int. Cl.⁵ .............. H01L 21/00; H01L 21/02; H01L 21/44; H01L 21/441
[52] U.S. Cl. ............ 437/176; 204/192.12; 204/192.15; 148/DIG. 139; 148/DIG. 140
[58] Field of Search .......... 437/176; 204/192.12, 204/192.15; 148/DIG. 17, DIG. 139, DIG. 140

[56] References Cited

U.S. PATENT DOCUMENTS

| | | | |
|---|---|---|---|
| 4,179,317 | 12/1979 | Sakai et al. | 437/130 |
| 4,277,883 | 7/1981 | Kaplan | 437/228 |
| 4,396,437 | 8/1983 | Kwok et al. | 437/41 |
| 4,477,311 | 10/1984 | Mimura et al. | 437/105 |
| 4,492,620 | 1/1985 | Matsuo et al. | 204/192.12 |
| 4,546,540 | 10/1985 | Ueyanagi et al. | 437/192 |
| 4,569,119 | 2/1986 | Terada et al. | 437/228 |
| 4,585,517 | 4/1986 | Stemple | 156/643 |
| 4,622,736 | 11/1986 | Drobny | 437/176 |
| 4,635,343 | 1/1987 | Kuroda | 437/179 |
| 4,694,564 | 9/1987 | Enoki et al. | 437/175 |
| 4,696,093 | 9/1987 | Welch | 437/176 |

FOREIGN PATENT DOCUMENTS

| | | | |
|---|---|---|---|
| 0077682 | 6/1977 | Japan | 437/176 |
| 0042380 | 4/1981 | Japan | 437/176 |
| 0086861 | 7/1984 | Japan | |
| 59-130425 | 7/1984 | Japan | |
| 60-6175 | 1/1985 | Japan | |
| 0263672 | 9/1986 | Japan | |
| 0289670 | 12/1986 | Japan | |
| 62-185314 | 8/1987 | Japan | |

OTHER PUBLICATIONS

Geissberger, Investigation of Reactively Sputtered Tungsten Nitride as High Temperature Stable Schottky Contacts to GaAs, J. Vac. Sci. Tech., vol. 4, No. 6, Nov. 1986, pp. 3091–3094.

McWilliams, Thermal Instability of Schottky Diode Barrier Heights Modified by Inert Ion Sputter-Etching Damage, IEEE Electron Device Letters, vol. EDL-7, No. 4, Apr. 1986, pp. 247–249.

Yamasaki, Sputter Etching Effects on GaAs Schottky Junctions, J. Electrochem. Soc., vol. 129, No. 12, Dec. 1982, pp. 2760–2764.

Vossen, Preparation of Surfaces for High Quality Interface Formation, J. Vac. Sci. Tech. A2(2), Jun. 1984, pp. 212–215.

Patent Abstracts of Japan, pub. No. 60173872, vol. 10, No. 11, Jan. 17, 1986.

Patent Abstracts of Japan, pub. No. 56164527, vol. 6, No. 52, Apr, 7, 1982.

Patent Abstracts of Japan, pub. No. 57049299, vol. 6, No. 119, Jul. 3, 1982.

*Primary Examiner*—Brian E. Hearn
*Assistant Examiner*—B. Everhart
*Attorney, Agent, or Firm*—Finnegan, Henderson, Farabow, Garrett & Dunner

[57] ABSTRACT

A method for manufacturing a semiconductor device with a Schottky electrode includes the steps of subjecting the surface of a GaAs substrate to a sputtering etching process in a sputtering processing chamber of a sputtering device; and depositing Schottky electrode material by sputtering on the surface of the substrate to form a Schottky electrode in the processing chamber without exposing the substrate to the atmosphere.

25 Claims, 2 Drawing Sheets

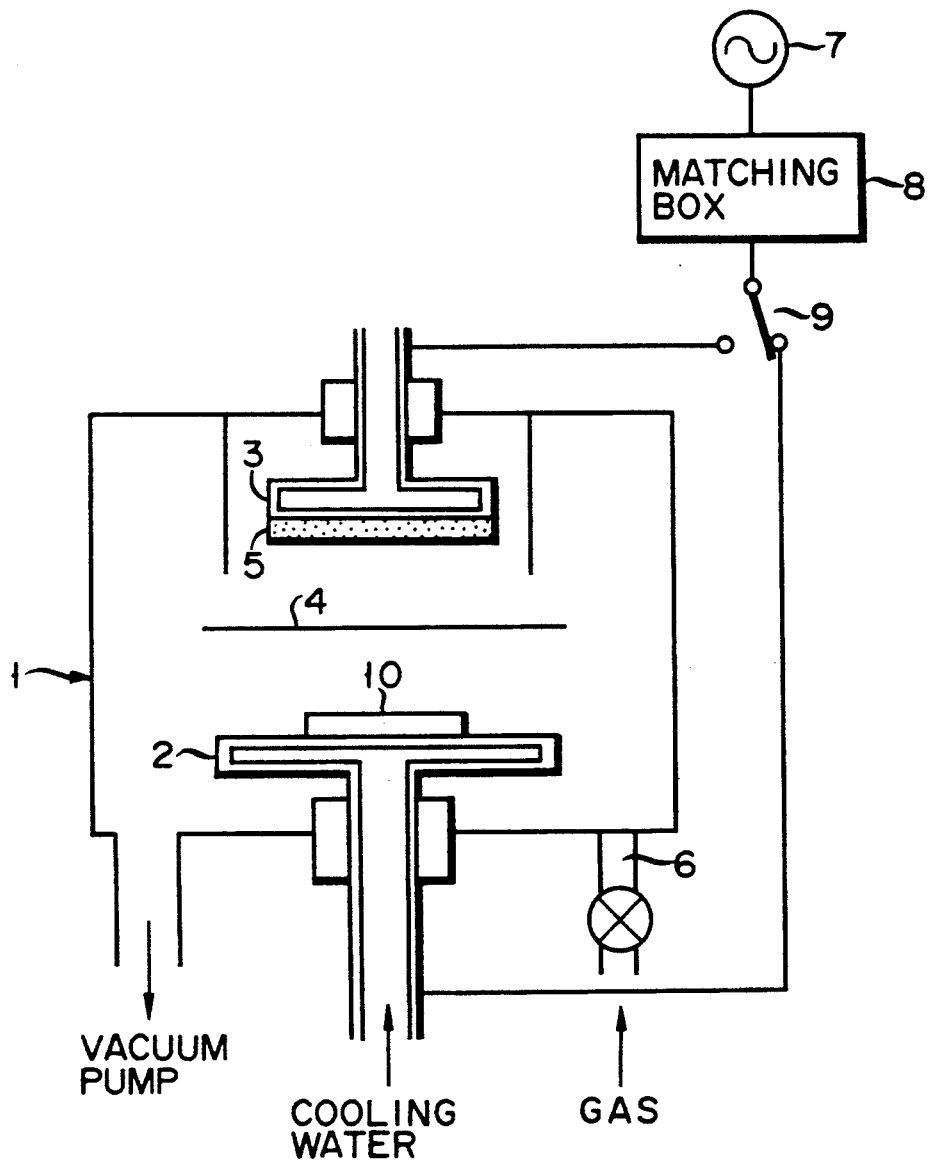
F I G. 1

METHOD FOR MANUFACTURING A SEMICONDUCTOR DEVICE WITH SCHOTTKY ELECTRODES

This application is a continuation of application Ser. No. 07/556,611, filed Jul. 24, 1990 now abandoned, which was a continuation of application Ser. No. 07/234,042 filed Aug. 19, 1988 now abandoned.

BACKGROUND OF THE INVENTION

Field of the Invention

This invention relates to a method for manufacturing semiconductor devices, and more particularly to a method for manufacturing a Schottky electrode on the surface of a GaAs (gallium arsenide) semiconductor substrate.

Description of the Related Art

In applications where Schottky electrode material of Schottky diodes or metal semiconductor field effect transistors (MESFETs) is deposited on a GaAs substrate by a sputtering method or a vapor deposition method, a pre-processing is effected to remove the natural oxide film on the surface of the semiconductor substrate. A wet-etching process or $NH_3$ (ammonium) plasma process is effected as the pre-processing, for example. The wet-etching process is effected by chemically cleaning the semiconductor substrate using ammonium fluoride ($NH_4F$), dilute hydrofluoride acid (HF), hydrochloric acid (HCl) or the like. However, in this case, it is impossible to completely eliminate the natural oxide film on the surface of the GaAs substrate. Further, as disclosed in papers pp. 18 to 23 (Shimada et al.) of "27th SEMICONDUCTOR INTEGRATED CIRCUIT SYMPOSIUM", the natural oxide film on the surface of the GaAs substrate can be completely removed by use of the $NH_3$ plasma processing. In this case, however, if the GaAs substrate is exposed to the atmosphere after the completion of the $NH_3$ plasma processing and before the Schottky electrode material is deposited on the substrate, the natural oxide film may form again on the surface of the substrate. As a result, a Schottky electrode will be formed on the natural oxide film. In this way, if the natural oxide film is formed between the Schottky electrode and the GaAs substrate, the desired Schottky junction cannot be attained. Therefore, the Schottky characteristics may fluctuate, so that the n value (environmental factor) may be increased and/or $\phi_B$ (barrier height) may be decreased.

As described above, the conventional method suffers from the disadvantage that since the surface of the substrate is exposed to the atmosphere after the natural oxide film on the GaAs substrate is removed by the plasma processing and before the Schottky electrode is formed on the substrate, the desired Schottky junction cannot be obtained.

SUMMARY OF THE INVENTION

An object of this invention is to provide a method for manufacturing semiconductor devices in which a Schottky electrode can be formed without forming a natural oxide film between the Schottky electrode and the GaAs substrate, thus attaining the desired Schottky junction.

The above object can be attained by a method for manufacturing a semiconductor device with a Schottky electrode, comprising the steps of (a) subjecting the surface of a GaAs substrate to a sputtering etching process in a sputtering processing chamber of a sputtering device; and (b) depositing Schottky electrode material by sputtering on the surface of the substrate to form a Schottky electrode in the same processing chamber without exposing the substrate to an atmosphere.

In this invention, since the sputtering etching step and the sputtering deposition step are successively effected in the vacuum chamber, the Schottky electrode can be formed directly on the surface of the GaAs substrate without forming the natural oxide film thereon, and a semiconductor device such as a MESFET or a Schottky diode having the desired Schottky junction can be obtained.

BRIEF DESCRIPTION OF THE DRAWINGS

FIG. 1 is a diagram schematically showing an example of a sputtering device which is used to effect a semiconductor device manufacturing method according to one embodiment of this invention.

DETAILED DESCRIPTION OF THE PREFERRED EMBODIMENTS

Figure 2A:
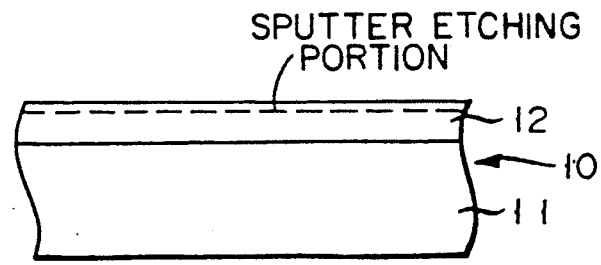
FIGS. 2A to 2E are cross sectional views showing the manufacturing steps of the semiconductor device according to one embodiment of this invention.

There will now be described a semiconductor device manufacturing method according to one embodiment of this invention.

FIG. 1 schematically shows the construction of an example of a sputtering device which is used to effect the semiconductor device manufacturing method according to one embodiment of this invention. The sputtering device includes sputtering processing chamber 1 which is kept in a predetermined vaccum condition by a vaccum pump (not shown). In processing chamber 1, lower electrode 2 and upper electrode 3 are disposed in opposition to and in parallel with each other and shutter 4 which can be used to shield upper electrode 3 from the outer atmosphere is movably mounted below upper electrode 3. GaAs substrate 10 to be sputtered, as described later, is held on lower electrode 2 by means of a holder (not shown), and target 5 formed of, for example, WSi (tungsten silicide) is held on the lower surface of upper electrode 3. Lower electrode 2 is formed with a hollow portion to receive cooling water from processing chamber 1, and gas inlet port 6 is provided on processing chamber 1. A gas supply source (not shown) is arranged outside processing chamber 1. An inert gas such as Ar can be used therefor. Further, switch 9 which selectively supplies high frequency power (for example, 13.56 MHz) from high frequency power source 7 to lower electrode 2 or upper electrode 3 via impedance matching box 8 is provided outside processing chamber 1.

Next, an example of the method for manufacturing the semiconductor device is explained with reference to FIGS. 2A to 2E. First, as shown in FIG. 2A, silicon ions ($Si^+$) are ion-implanted into GaAs substrate 11 at a main plane having the Miller indices (100) under conditions where the acceleration voltage is set at 150 keV and the dose amount is set at $2.5 \times 10^{12} cm^{-2}$. After this, substrate 11 is subjected to a heat treatment for 15 minutes at 820° C. in an atmosphere of arsine ($AsH_3$) so as to anneal the doped silicon ions. As a result, n-type impurity region 12 of low impurity concentration is formed in the surface of substrate 11. The n-type GaAs substrate thus obtained is chemically cleaned by use of NH4F (ammonium fluoride) to remove the natural oxide film on the surface, although it is not completely removed. Then, GaAs substrate 10 is set in sputtering processing chamber 1, and the pressure in processing chamber 1 is lowered to $1 \times 10^{-4}$ Pa. After this, Ar (argon) gas is introduced as etchant gas into processing chamber 1 until the inner pressure reaches approx. 0.8 Pa. Then, high frequency power of approx. 1 kW is applied to lower electrode 2 in order to effect a sputtering etching process for the substrate surface for about 5 minutes. As a result of this, the substrate surface layer is partially removed as shown by the broken lines in FIG. 2A. In this case, in order to prevent target 5 from being contaminated, shutter 4 is previously closed.

Figure 2B:
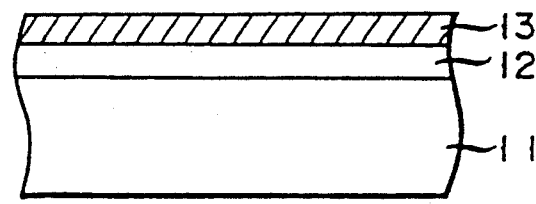

Next, $N_2$ (nitrogen) gas is introduced into processing chamber 1 to provide a partial pressure equal to 10% of the total gas pressure in processing chamber 1, thus creating an atmosphere of $(Ar+N_2)$. Then, high frequency power is applied to upper electrode 3 and shutter 4 is opened so as to effect a reactive sputtering process. This operation is effected until a nitride film of tungsten silicide or WSi-Nx film 13 is deposited to a thickness of approx. 150 nm on the substrate surface as shown in FIG. 2B. In this case, processing chamber 1 is held in a substantially vaccum condition while a process, from the step of sputtering-etching the substrate surface to the step of sputtering-depositing the substrate surface, is effected. In this way, since the substrate surface is not exposed to the atmosphere, the natural oxide film will not be formed between WSi-Nx film 13 and the substrate surface, permitting WSi-Nx film 13 to be formed directly on the substrate surface.

Figure 2C:
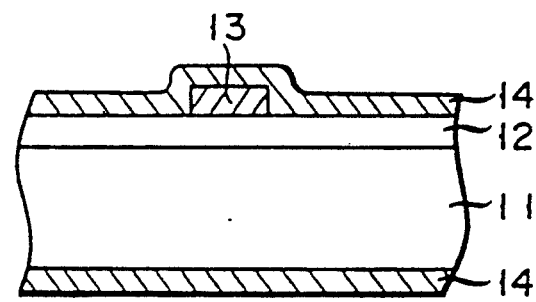
Figure 2D:
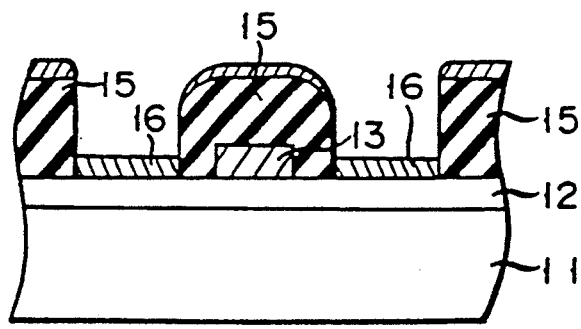
Figure 2E:
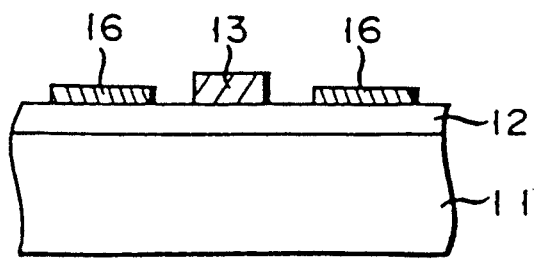

After this, the Schottky electrode of a Schottky diode or MESFET is formed according to the ordinary process. That is, a photoresist pattern with a 1 mm diameter corresponding to the size of the Schottky electrode is formed on WSi-Nx film 13 by a photolithographic process, and then WSi-Nx film 13 is patterned by a reactive ion etching method (RIE) or chemical dry etching method (CDE) with the photoresist pattern used as a mask as shown in FIG. 2C. Then, PSG (phosphor silicate glass) films 14 are formed as insulation coating films to a thickness of approx. 400 nm on both surfaces of the substrate, and a heat treatment is effected for 10 minutes at a temperature of about 800° C. in order to restore the damage caused in the substrate sputtering process. After this, in order to form an ohmic electrode, PSG film 14 is etched out, resist pattern 15 is formed as shown in FIG. 2D, and a two-layered ohmic electrode layer such as Ni/AuGe film 16 having a lower layer of AuGe (gold germanium) and an upper layer of Ni (nickel), for example, is formed. Then, resist pattern 15 is removed, and a heat treatment is effected at a temperature of 430° C. in $N_2$ gas for three minutes to form an alloy. As a result, a GaAs Schottky diode having Schottky electrode 13 and ohmic electrode 16 is obtained as shown in FIG. 2E.

The Schottky diode formed to have the Schottky electrode is completed as a discrete part after being subjected to the succeeding manufacturing steps.

Further, in order to lower the resistance of that part of the n-type low impurity concentration layer 12 which lies in the substrate surface under ohmic electrode 16, it is possible to dope an impurity into the part to form an n-type high impurity concentration region.

In the above embodiment, WSi is used as the target material, but the invention is not limited to the use of WSi. For example, other refractory metals such as W, WNx, and Ti can be used, and in this case, the inert gas used in the sputtering deposition process will be selected according to the type of refractory metal used.

According to the manufacturing method of the above embodiment, since the sputtering etching step and the sputtering deposition step are successively effected in the vacuum chamber, the Schottky electrode can be formed directly on the GaAs substrate surface without forming the natural oxide film therebetween and MESFETs and Schottky diodes having the desired Schottky junction can be obtained. The characteristics of the Schottky diode manufactured according to the above embodiment can be improved over those of the Schottky diode manufactured without effecting the sputtering etching process, as shown in the following table. In the following table, the average values of the diode characteristics measured at five selected points in the semiconductor wafer are shown.

TABLE 1

| Schottky electrode material | substrate etching | n Value | $\Phi_\beta$ | leak current (nA) when reverse bias $(V_R = -10 V)$ is applied |
|---|---|---|---|---|
| $WSi_{0.6}$–N | no | 1.07 | 0.771 | −67 |
| $WSi_{0.6}$–N | yes | 1.06 | 0.798 | −16 |

In the above table, the composition ratio of W and Si in the Schottky electrode material WSi-N is 1:0.6. In this example, there occurs no damage due to etching, and the n value (environmental factor) and $\phi_B$ (barrier height) are not deteriorated, and the leak current occurring when the reverse bias voltage $(V_R)$ is applied is suppressed to a minimum.

As described above, according to the semiconductor device manufacturing method of this invention, a semiconductor device can be manufactured in which the Schottky electrode can be formed by deposition on the GaAs substrate without forming the natural oxide film therebetween and thus the desired Schottky characteristics can be obtained.

What is claimed is:

1. A method for manufacturing a semiconductor device having a Schottky electrode, said method comprising the steps of:
    subjecting a surface of a GaAs substrate to a sputter etching process in a sputtering processing chamber of a sputtering device, said sputter etching process being performed in an atmosphere of inert gas;
    depositing a refractory metal by reactive sputtering on the surface of said GaAs substrate to form said Schottky electrode in said processing chamber, without removing said GaAs substrate from said processing chamber, said reactive sputtering being performed in an inert gas atmosphere including $N_2$ to form a nitride film of refractory metal on said GaAs substrate, wherein a partial pressure of the $N_2$ in the inert gas atmosphere is selected to be substantially 10%, thereby producing a WSi-Nx/GaAs wafer; and
    annealing the WSi-Nx/GaAs wafer at 800° C. for a predetermined period of time in order to restore damage caused thereto in the depositing step.

2. The method of claim 1, wherein said sputtering etching process is performed in an inert gas atmosphere comprised of Ar, and said reactive sputtering is performed in an insert gas atmosphere comprised of Ar and $N_2$.

3. The method of claim 1, wherein, prior to the step of subjecting said GaAs substrate to said sputter etching process, the method further includes the step of:
   chemically cleaning said surface of said GaAs substrate.

4. The method of claim 1, wherein said sputter etching process and said reactive sputtering are carried out using said GaAs substrate and said refractory material as targets.

5. The method of claim 1, wherein said sputter etching process is performed in an inert gas atmosphere of Ar and said reactive sputtering is carried out using WSi as a target.

6. A method for manufacturing a semiconductor device, said method comprising the steps of:
   orienting a GaAs substrate having a main plane at a predetermined location in a sputtering processing chamber;
   implanting silicon ions into the main plane of said GaAs substrate;
   annealing said GaAs substrate to form an n-type impurity region on the main plane of said GaAs substrate;
   chemically cleaning said GaAs substrate to remove any oxide film unintentionally formed on the main plane of said GaAs substrate;
   sputter etching said GaAs substrate, in said sputtering processing chamber, in an inert gas atmosphere to partially remove a surface of the main plane of said GaAs substrate;
   reactive sputtering, using a refractory metal, in said sputtering processing chamber, without removing said GaAs substrate from said processing chamber, on the main plane of said GaAs substrate in an inert gas atmosphere including $N_2$ to form a nitride film of refractory metal on the partially removed surface of the main plane of said GaAs substrate, wherein a partial pressure of the $N_2$ in the inert gas atmosphere is selected to be substantially 10%, thereby producing a WSi-Nx/GaAs wafer; and
   annealing the WSi-Nx/GaAs wafer at 800° C. for a predetermined period of time in order to restore damage caused thereto in the reactive sputtering step.

7. The method of claim 6, wherein the main plane of said GaAs substrate is defined by Miller indices (100).

8. The method of claim 6, wherein said annealing step is performed in an atmosphere of $AsH_3$ gas.

9. The method of claim 6, wherein said chemical cleaning step is performed using $NH_4F$.

10. The method of claim 6, wherein said sputter etching and reactive sputtering steps are carried out using said GaAs substrate and said refractory metal as targets.

11. The method of claim 6, wherein said sputter etching step is carried out in an inert gas atmosphere of Ar, and said reactive sputtering step is carried out using WSi as a target.

12. A method for manufacturing a semiconductor device having a GaAs substrate and a Schottky electrode, said method comprising the steps of:
   chemically cleaning a surface of said GaAs substrate;
   subjecting said surface of said GaAs substrate to a sputter etching process in a sputtering processing chamber of a sputtering device, said sputter etching process being performed in an inert gas atmosphere of Ar;
   depositing a refractory material by reactive sputtering on the surface of said GaAs substrate, using WSi as a target, to form said Schottky electrode in said processing chamber, without removing said GaAs substrate from said processing chamber, said reactive sputtering being performed in an inert gas atmosphere of Ar and $N_2$ to form a nitride film of tungsten silicide on said GaAs substrate, wherein a partial pressure of $N_2$ in the inert gas atmosphere of Ar and $N_2$ is selected to be substantially 10%, thereby producing a WSi-Nx/GaAs wafer; and
   annealing the WSi-Nx/GaAs wafer at 800° C. for a predetermined period of time in order to restore damage caused thereto in the depositing step.

13. A method for manufacturing a semiconductor device, said method comprising the steps of:
   orienting a GaAs substrate having a main plane, defined by Miller indices (100), at a predetermined location in a sputtering processing chamber;
   implanting silicon ions into the main plane of said GaAs substrate;
   annealing said GaAs substrate in an atmosphere of $AsH_3$ to form an n-type impurity region on the main plane on said GaAs substrate;
   chemically cleaning said GaAs substrate with $NH_4F$ to remove any oxide film unintentionally formed on the main plane of said GaAs substrate;
   sputter etching said GaAs substrate, in said sputtering processing chamber, in an inert gas atmosphere of Ar to partially remove a surface of the main plane of said GaAs substrate;
   reactive sputtering on the main plane of said GaAs substrate, in said sputtering processing chamber, without removing said GaAs substrate from said processing chamber, in an inert gas atmosphere including $N_2$, the reactive sputtering being carried out using WSi as a target to form a nitride film of tungsten silicide on the partially removed surface of the main plane of said GaAs substrate, wherein a partial pressure of $N_2$ in the inert gas atmosphere is selected to be substantially 10%, thereby producing a WSi-Nx/GaAs wafer; and
   annealing the WSi-Nx/GaAs wafer at 800° C. for a predetermined period of time in order to restore damage caused thereto in the reactive sputtering step.

14. A method for manufacturing a semiconductor device having a GaAs substrate and a Schottky electrode, said method comprising the steps of:
   chemically cleaning a surface of said GaAs substrate;
   subjecting said surface of said GaAs substrate to a sputter etching process in a sputtering processing chamber of a sputtering device, said sputter etching process being performed in an inert gas atmosphere comprised of Ar; and
   depositing a refractory metal by reactive sputtering on the surface of said GaAs substrate to form said Schottky electrode in said processing chamber, without removing said GaAs substrate from said processing chamber, said reactive sputtering being performed in an inert gas atmosphere of Ar and $N_2$ to form a nitride film of refractory metal on said GaAs substrate, wherein a partial pressure of $N_2$ in the inert gas atmosphere of Ar and $N_2$ is selected to be substantially 10%, thereby producing a WSi-Nx/GaAs wafer; and
   annealing the WSi-Nx/GaAs wafer at 800° C. for a predetermined period of time in order to restore damage caused in the depositing step.

15. The method of claim 14, wherein said sputter etching process and said reactive sputtering are carried out using said GaAs substrate and said refractory material as targets.

16. The method of claim 14, wherein said reactive sputtering is carried out using WSi as a target.

17. A method for manufacturing a semiconductor device, said method comprising the steps of:
orienting a GaAs substrate, having a main plane defined by Miller indices (100), at a predetermined location in a sputtering processing chamber;
implanting silicon ions into the main plane of said GaAs substrate;
annealing said GaAs substrate in an atmosphere of $AsH_3$ to form an n-type impurity region on the main plane of said GaAs substrate;
chemically cleaning said GaAs substrate to remove any oxide film unintentionally formed on the main plane of said GaAs substrate;
sputter etching said GaAs substrate in an inert gas atmosphere to partially remove a surface of the main plane of said GaAs substrate;
reactive sputtering, using a refractory metal, on the main plane of said GaAs substrate in an inert gas atmosphere including $N_2$ to form a nitride film of refractory metal on the partially removed surface of the main plane of said GaAs substrate, without removing said GaAs substrate from said processing chamber, wherein a partial pressure of $N_2$ in the inert gas atmosphere is selected to be substantially 10%, thereby producing a WSi-Nx/GaAs wafer; and
annealing the WSi-Nx/GaAs wafer at 800° C. for a predetermined period of time in order to restore damage caused thereto in the reactive sputtering step.

18. The method of claim 17, wherein said chemical cleaning step is performed using $NH_4F$.

19. The method of claim 17, wherein said sputter etching and reactive sputtering steps are carried out using said GaAs substrate and said refractory metal as targets.

20. The method of claim 17, wherein said sputter etching step is carried out in an inert gas atmosphere of Ar, and said reactive sputtering step is carried out using WSi as a target.

21. The method of claim 17, wherein said annealing step is performed at 820° for 15 minutes in an atmosphere of $AsH_3$.

22. A method for manufacturing a semiconductor device having a Schottky electrode, said method comprising the steps of:
subjecting a surface of a GaAs substrate to a sputter etching process in a sputtering processing chamber of a sputtering device which includes a shutter, said sputter etching process being performed in an atmosphere of inert gas for about five minutes with said shutter previously closed;
depositing a refractory metal, by reactive sputtering on the surface of said GaAs substrate to form said Schottky electrode in said sputtering processing chamber, without removing said GaAs substrate from said processing chamber, said reactive sputtering being performed in an inert gas atmosphere including $N_2$ to form a nitride film of refractory metal on said GaAs substrate, wherein a partial pressure of $N_2$ in the inert gas atmosphere is selected to be substantially 10%, thereby producing a WSi-Nx/GaAs wafer; and
annealing the WSi-Nx/GaAs wafer at 800° C. for a predetermined period of time in order to restore damage caused thereto in the depositing step.

23. A method for manufacturing a semiconductor device having a Schottky electrode, said method comprising the steps of:
subjecting a surface of a GaAs substrate to a sputter etching process in a sputtering processing chamber of a sputtering device, said sputter etching process being performed in an atmosphere of inert gas;
depositing a material by reactive sputtering on the surface of said GaAs substrate to form said Schottky electrode in said processing chamber, without removing said GaAs substrate from said processing chamber, said reactive sputtering being performed in an inert gas atmosphere including $N_2$ to form a nitride film of said material on said GaAs substrate, wherein a partial pressure of the $N_2$ in the inert gas atmosphere is selected to be substantially 10%, thereby producing a WSi-Nx/GaAs wafer; and
annealing the WSi-Nx/GaAs wafer at 800° C. for a predetermined period of time in order to restore damage caused thereto in the depositing step.

24. The method as recited in claim 23, wherein said material is tungsten silicide.

25. The method as recited in claim 23, wherein said material is a refractory material.

* * * * *